United States Patent [19]

Furuyama

[11] Patent Number: 5,258,954
[45] Date of Patent: Nov. 2, 1993

[54] SEMICONDUCTOR MEMORY INCLUDING CIRCUITRY FOR DRIVING PLURAL WORD LINES IN A TEST MODE

[75] Inventor: Tohru Furuyama, Tokyo, Japan

[73] Assignee: Kabushiki Kaisha Toshiba, Kawasaki, Japan

[21] Appl. No.: 908,744

[22] Filed: Jul. 6, 1992

Related U.S. Application Data

[63] Continuation of Ser. No. 544,614, Jun. 27, 1990, abandoned.

[30] Foreign Application Priority Data

Jun. 30, 1989 [JP] Japan .................................. 1-169631

[51] Int. Cl.$^5$ .......................... G11C 29/00; G11C 8/00
[52] U.S. Cl. ................................ 365/201; 365/238.5;
365/230.06; 371/21.1
[58] Field of Search ................ 365/201, 238.5, 230.06;
371/21.1

[56] References Cited

U.S. PATENT DOCUMENTS

| | | | |
|---|---|---|---|
| 4,342,103 | 7/1982 | Higuchi et al. | 365/230.08 |
| 4,527,254 | 7/1985 | Ryan et al. | 365/51 |
| 4,651,304 | 3/1987 | Takata | 365/201 |
| 4,751,679 | 6/1988 | Dehganpour | 365/201 |
| 4,779,272 | 10/1988 | Kohda et al. | 365/201 |
| 4,811,299 | 3/1989 | Miyazawa et al. | 365/201 |
| 4,816,757 | 3/1989 | Hutchins | 324/158 R |
| 4,819,212 | 4/1989 | Nakai et al. | 365/201 |
| 4,860,259 | 8/1989 | Tobita | 365/201 |
| 4,879,689 | 11/1989 | Atsumi et al. | 365/201 |
| 4,954,994 | 9/1990 | Hashimoto | 365/201 |

FOREIGN PATENT DOCUMENTS

| | | |
|---|---|---|
| 0055906 | 7/1982 | European Pat. Off. . |
| 0314180 | 5/1989 | European Pat. Off. . |
| 0034796 | 2/1988 | Japan .................... 365/238.5 |

*Primary Examiner*—Glenn Gossage
*Attorney, Agent, or Firm*—Banner, Birch, McKie & Beckett

[57] ABSTRACT

A semiconductor memory includes circuitry for driving plural word lines in a test mode. The semiconductor memory includes a plurality of memory cells; a plurality of word lines connected to the memory cells; a plurality of bit lines connected to the memory cells; and a drive circuit connected to the word lines for, in a test mode, selectively driving all the word lines or, alternatively, driving a select number of word lines.

19 Claims, 5 Drawing Sheets

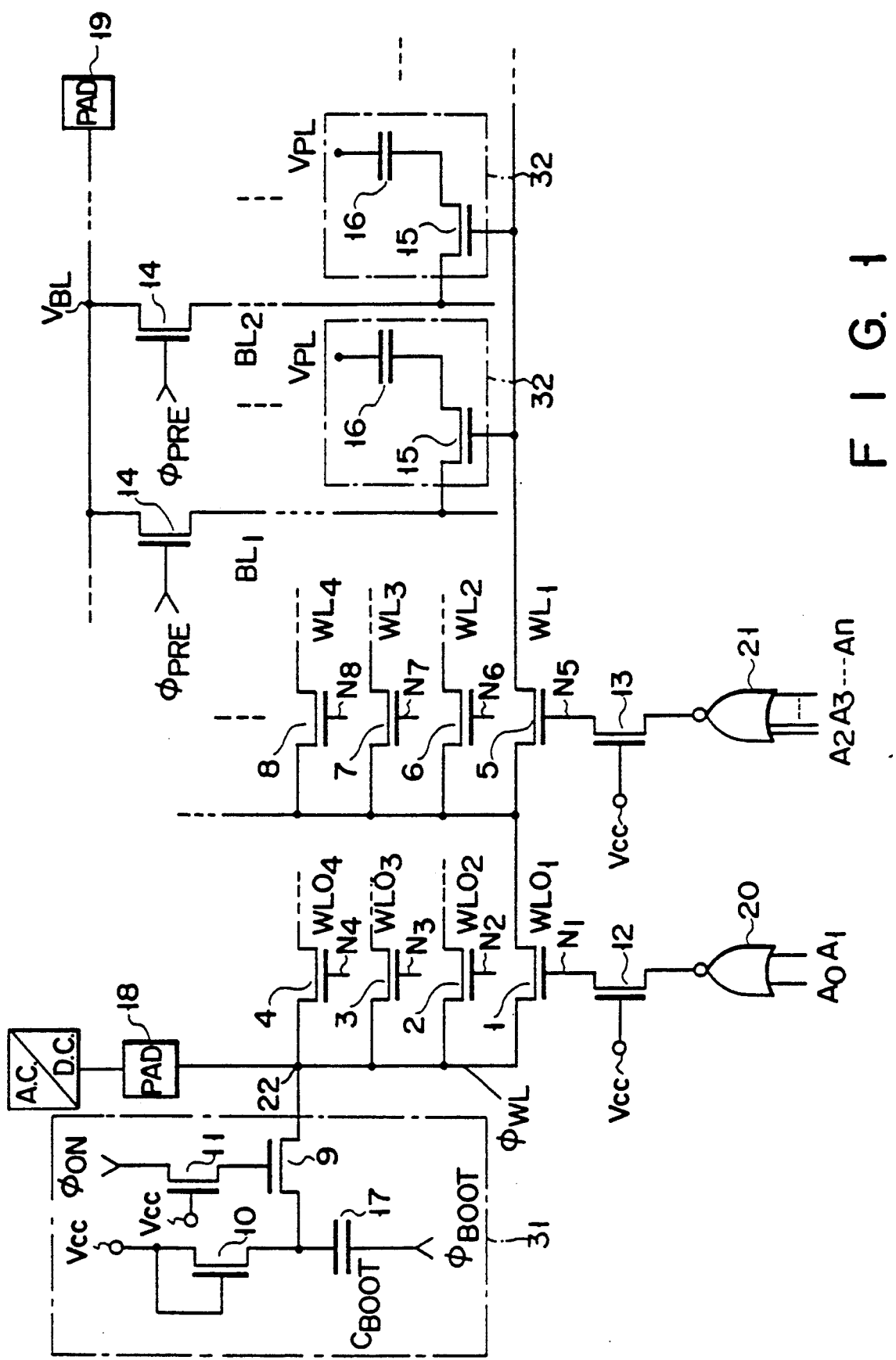
F I G. 1

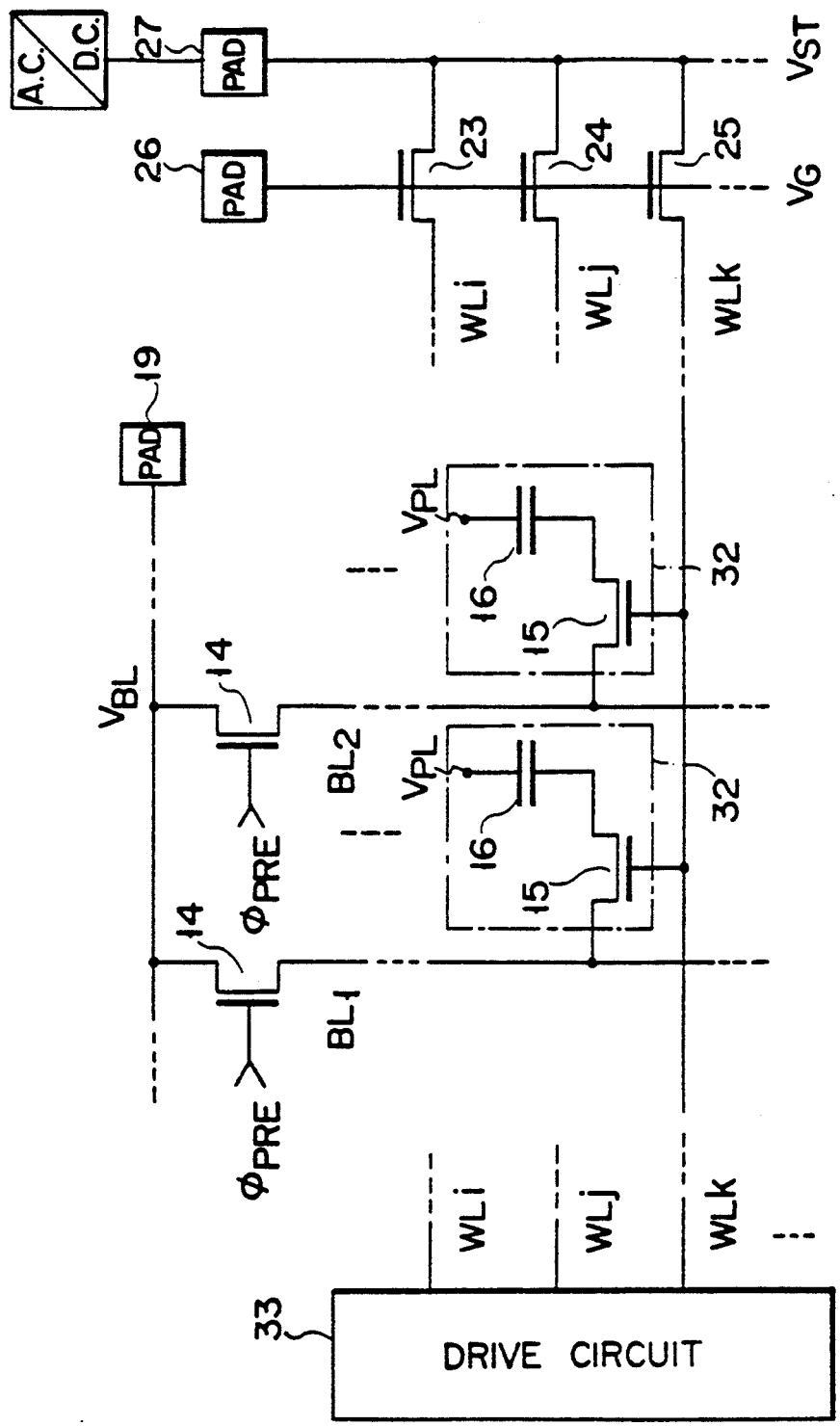
F I G. 2

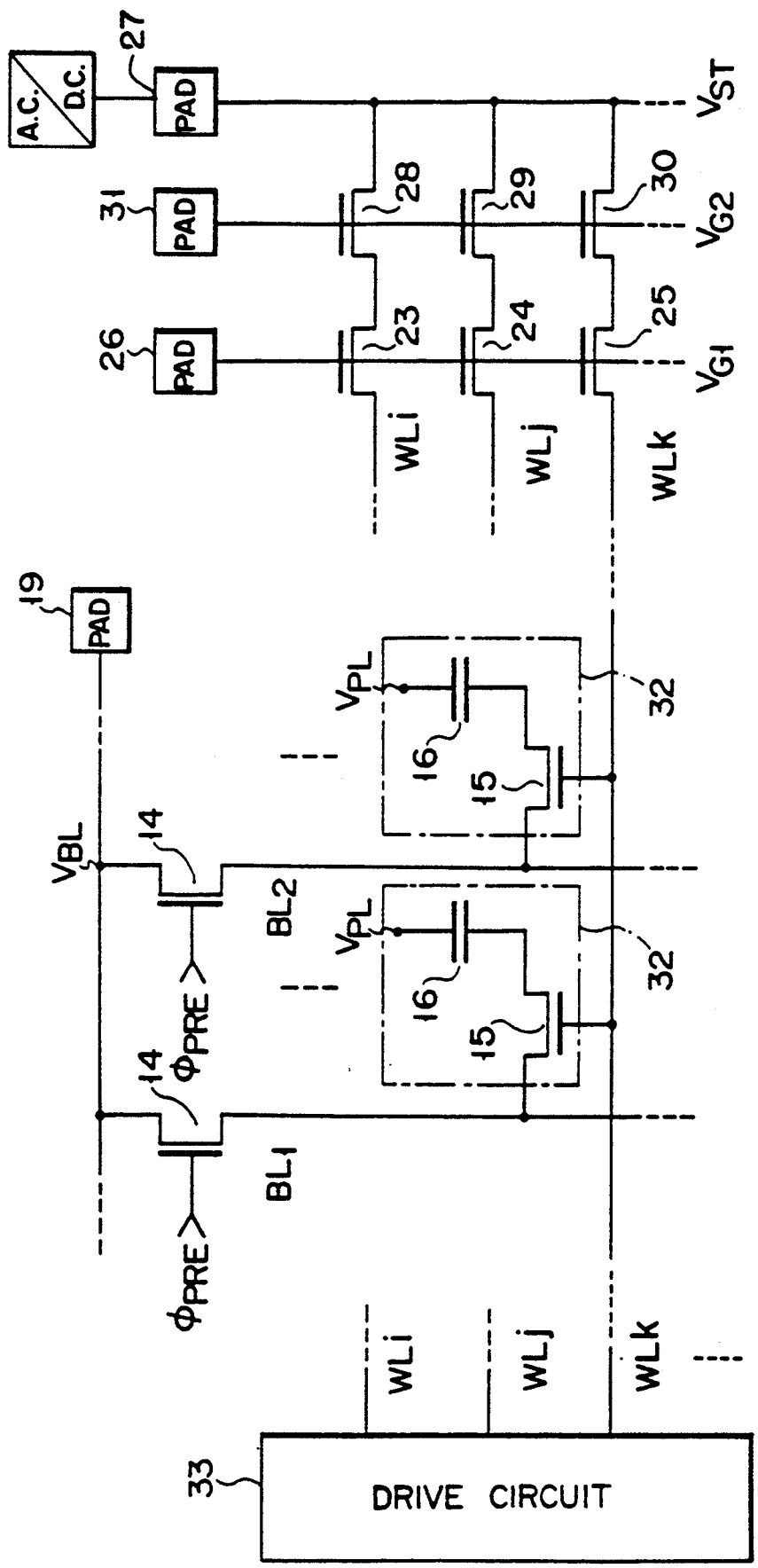
F I G. 4

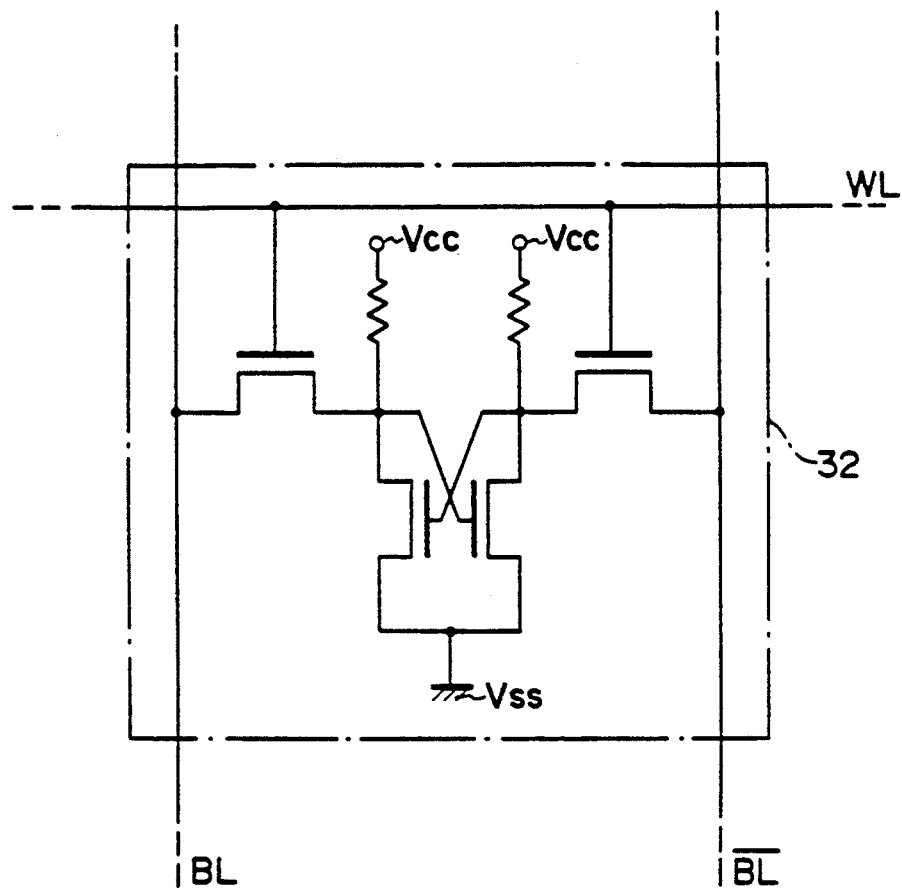
F I G. 5

SEMICONDUCTOR MEMORY INCLUDING CIRCUITRY FOR DRIVING PLURAL WORD LINES IN A TEST MODE

This application is a continuation, of application Ser. No. 07/544,614, filed Jun. 27, 1990, now abandoned.

BACKGROUND OF THE INVENTION

1. Field of the Invention

The present invention relates to a technique of applying an accelerated stress to a cell transistor of a semiconductor memory to ensure the reliability of a gate insulator of the cell transistor. The present invention relates particularly to a semiconductor memory device used in a dynamic random access memory (RAM) (referred to as a DRAM hereinafter) in which a boost voltage is applied to word lines, and a static random access memory (referred to as an SRAM).

2. Description of the Related Art

A screening test to eliminate devices which inherently include a defect has been conventionally performed in order to ensure the reliability of a semiconductor device. The screening test mainly includes methods for accelerating an electric field and for accelerating a temperature. A burn-in method capable of simultaneously achieving the acceleration of an electric field and that of a temperature is frequently used as the screening test. The burn-in method is effective in a device having a possibility of malfunctioning in the earlier stage of its usage.

In the screening test of a semiconductor memory device using the burn-in method, word lines are sequentially accessed by address input. Therefore, when the word lines are sequentially accessed during the burn-in operation, a cell transistor connected to a word line receives a stress (more precisely the maximum stress) less frequently than a transistor of a peripheral circuit does.

For example, the number of word lines of a 4 mega bit (4 mb) DRAM is 4096, and the number of word lines which are selected in one cycle from among the 4096 word lines, is only four. Access to all cell transistors is thus completed in 1024 cycles. In other words, the time for which a stress is applied to the cell transistor is only 1/1024 the time for which a stress is applied to the transistor of the peripheral circuit. This type of screening test is not advantageous since it does not efficiently and quickly test for a defective cell transistor and it may degrade peripheral circuitry.

In recent DRAMs, generally, a Vcc/2 voltage which is a half of a power source voltage, is applied to a capacitor electrode of a memory cell. The electric field on the capacitor insulation film is weak so that, even though the insulation film is thin, it is usually reliable. However, the electric field is strong on the gate oxide film of a transistor to which a boosted voltage (e.g., around 1.5 Vcc) is applied so that, even though the oxide film is thick, it is more likely to be unreliable. Therefore, the transistor to which the boosted voltage is applied, especially needs to undergo the screening test however, it is a cell transistor and, as described above, the efficiency of the screening test is only 1/1024.

SUMMARY OF THE INVENTION

It is accordingly an object of the present invention to provide a semiconductor memory device which overcomes the above drawback wherein a stress is infrequently applied to a cell transistor because to improve the stress acceleration efficiency of the cell transistor, it is desirable to undergo a proper screening test.

To attain the above object, a semiconductor memory device according to one aspect of the present invention includes a plurality of memory cells; a plurality of word lines connected to the memory cells; a plurality of bit lines connected to the memory cells; and a drive circuit connected to the word lines, for, in a test mode, driving all the word lines, alternatively, for driving a select number of word lines whose number is more than that of the number of word lines which are selected in a normal operation mode.

A semiconductor memory device according to another aspect of the present invention includes a plurality of memory cells; a plurality of word lines connected to the memory cells each word line having two ends; a plurality of bit lines connected to the memory cells; a drive circuit connected to one end of the word lines, for driving a selected word line in a normal operation mode; and means connected to the other end of the word lines, for, in a test mode, driving all the word lines or alternatively, for driving a select number of word lines whose number is more than that of the number of word lines selected in the normal operation mode.

A semiconductor memory device according to still another aspect of the present invention includes a plurality of memory cells; a plurality of word lines connected to the memory cells, each word line having two ends; a plurality of bit lines connected to the memory cells; a drive circuit connected to the one end of the word lines, for driving selected word lines in a normal operation mode; and a plurality of MOS transistors whose drains are connected to the other end of the word lines, whose gates are connected in common to one another, and whose sources are connected in common to one another.

A semiconductor memory device according to still another aspect of the present invention includes a plurality of memory cells; a plurality of word lines connected to the memory cells, each word line having two ends; a plurality of bit lines connected to the memory cells; a drive circuit connected to one end of the word lines, for driving selected word lines in a normal operation mode; a first plurality of MOS transistors whose drains are connected to the other end of the word lines and whose gates are connected in common to one another; and a second plurality of MOS transistors whose drains are connected to sources of the first MOS transistors, whose gates are connected in common to one another, and whose sources are connected in common to one another.

Additional objects and advantages of the invention will be set forth in the description which follows, and in part will be obvious from the description, or may be learned through use of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate the presently preferred embodiments of the invention, and, together with the general description given above and the detailed description of the preferred embodiments given below, serve to explain the principles of the invention.

FIG. 1 is a circuit diagram showing a semiconductor memory device according to a first embodiment of the present invention;

FIG. 2 is a circuit diagram showing a semiconductor memory device according to a second embodiment of the present invention;

FIG. 4 is a circuit diagram showing a semiconductor memory device according to a third embodiment of the present invention; and FIG. 5 is a circuit diagram showing a modification of a memory cell.

DETAILED DESCRIPTION OF THE PREFERRED EMBODIMENTS

Figure 3:
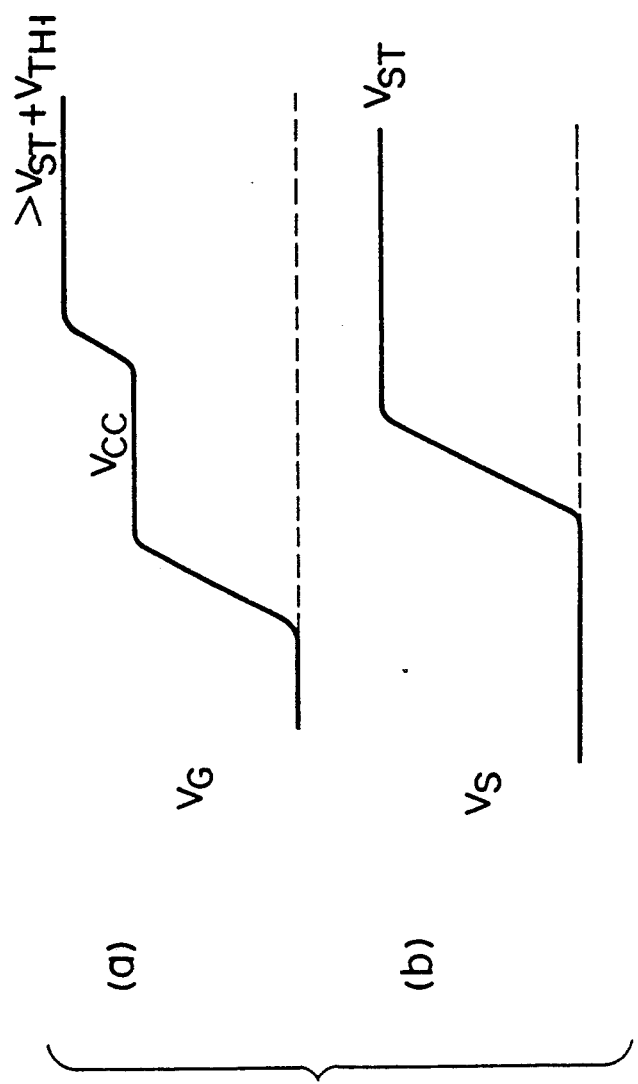
FIG. 3 is a timing chart for explaining the semiconductor memory device shown in FIG. 2.

An embodiment of the present invention will be described in detail with reference to the accompanying drawings. The elements common to all the drawings are denoted by the same reference numerals to avoid repeating the descriptions of the same elements.

FIG. 1 is a circuit diagram showing a semiconductor memory device according to the first embodiment of the present invention. In FIG. 1, reference numerals 1 to 9 indicate transfer gates; 10 to 13, MOS transistors serving as barriers against a boosted voltage; 14, a MOS transistor for precharging a bit line; 15, a cell transistor of a memory cell; 16, a cell capacitor of a memory cell; 17, a MOS capacitor for boosting a voltage; 18 and 19, bonding pads; 20 and 21, NOR gates; 22, a node; WLOm (m=1, 2, 3, 4), first word lines; WLn (n=1, 2, 3, 4, ...), second word lines; BLn (n=1, 2, ...), bit lines; $\phi_{BOOT}$, a boosting signal; $\phi_{ON}$, an on-signal of transfer gate 9; and $\phi_{WL}$, drive signals of the word lines.

The first embodiment of the present invention is applied to a drive circuit for selecting a word line of memory cells.

Signal supply unit 31 for supplying drive signals $\phi_{WL}$ of the word lines in a normal operation mode is connected to node 22. Bonding pad 18, which is not used in the normal operation mode, is also connected to node 22. Further, first word lines WLOm (m=1, 2, 3, 4) are connected to node 22 through transfer gates 1-4. Second word lines WLn (n=1, 2, 3, 4, ...) are connected to first word line WLO$_1$ through the transfer gates (5, 6, 7, 8, ...). Similarly, second word lines (not shown) are connected to other first word lines WLOn (n=2 to 4) through transfer gates (not shown). Transfer gates 1 to 4 have signals, one of which is selected according to addresses A$_0$ and A$_1$. Transfer gates 5, 6, 7, 8, ... have signals, one of which is selected according to addresses A$_2$ to A$_n$. Although not shown, it is to be understood the gates of transistors 2-4 and 6-8 are connected to circuitry similar to that connected to the gates of transistors 1 and 5, respectively. In the normal operation of the semiconductor device, transfer gates 1 to 4 and transfer gates 5, 6, 7, 8, ... are selectively turned on to select a word line. Memory cells 32 are connected to second word line WL$_1$. Similarly, memory cells (not shown) are connected to other second word lines WLn (n=2, 3, 4). Memory cell 32 includes cell transistor 15 and cell capacitor 16. The gate of cell transistor 15 of memory cell 32 is connected to second word line WL$_1$. One of the electrodes of cell capacitor 16 is connected to the source of cell transistor 15. Cell plate voltage V$_{PL}$ is applied to the other electrode of cell capacitor 16. A bit line BLn (n=1, 2, ...) is connected to the drain of cell transistor 15. Bit line BLn is connected to the drain of MOS transistor 14 for precharging the bit line. Precharge signal $\phi_{PRE}$ is input to the gate of MOS transistor 14. Bonding pad 19, which is not used in the normal operation mode of the memory device, is connected to the source of MOS transistor 14.

In the semiconductor memory device so arranged, the number of word lines to be selected is controlled by addresses A$_0$ to A$_n$ in the normal operation mode. In a stress application mode of a screening test, however, addresses A$_0$ to A$_n$ are so controlled that transfer gates 1 to 4 and transfer gates 5, 6, 7, 8, ... can be all turned on. To turn on all these transfer gates, the levels of all the true and complement signals of addresses (A$_0$ to A$_n$ and $\overline{A_0}$ to $\overline{A_n}$) supplied to NOR gates 20 and 21 need to be made low.

In the stress application mode of the present invention, transfer gates 1 to 4 and transfer gates 5, 6, 7, 8, ... are all turned on to drive all the word lines. However, capacitor 17 for boosting the voltage of the word lines has only enough capacitance (C $_{BOOT}$) to drive the word lines selected in the normal operation mode. In other words, capacitance C$_{BOOT}$ is insufficient to drive all the word lines and cannot be used for the screening test. In the present invention, therefore, bonding pad 18, which is not used in the normal operation, is connected to node 22. A desired voltage is applied from bonding pad 18 to node 22; accordingly, all the word lines are driven and a stress is applied to all cell transistors 15.

Similarly, bonding pad 19, which is not used in the normal operation mode, is connected to signal line V$_{BL}$ for precharging the bit lines. In the screening test, a desired voltage (e.g., ground voltage Vss) is applied to bonding pad 19 and a desired voltage is thus applied to bit line BL$_n$.

When direct current (D.C.) voltage is applied to bonding pad 18 to increase the acceleration efficiency of a stress applied to a gate insulation film of cell transistor 15, there is a strong possibility that the voltage of word line WLn (n=1, 2, ...) is lowered by leakage as time passes. It is effective in this case to apply an alternating current (A.C.) voltage to bonding pad 18.

According to the semiconductor memory device as described above, the percentage of word lines to be selected from among all the word lines can be increased. More specifically, the stress application efficiency of the word lines can be improved 1000 to 2000 times that in a conventional acceleration method such as a burn-in method wherein only four word lines are selected from among 4096 word lines of the 4 Mega (4 mb) DRAM. The time required for applying a stress in the present invention is thus 1/1000 to 1/2000 that in the conventional method and accordingly the efficiency of a screening test for the cell transistors of the memory cells can be greatly improved. If a defective transfer gate is found in advance in die sort, it can be replaced by a spare cell of the redundancy circuit. The test efficiency can be enhanced by shortening or eliminating the burn-in time after assembly of the semiconductor memory device.

Furthermore, the die sort can be performed after a weak cell transistor is found beforehand by inserting a process for applying a stress for a predetermined period of time. Since no stress is applied during the tie sort, a tester need not be stopped for the stressing and an equipment can be effectively employed.

FIG. 2 is a circuit diagram showing a semiconductor memory device according to the second embodiment of the present invention. In FIG. 2, reference numerals 23 to 25 denote MOS transistors, 26 and 27 indicate bonding pads, and $WL_i$, $WL_j$ and $WL_k$ show word lines.

According to the second embodiment, drive circuit 33 for driving a selected word line in a normal operation mode of the semiconductor memory device, is connected to one end of each of word lines $WL_i$, $WL_j$ and $WL_k$. The drains of MOS transistors 23 to 25 are connected to the other ends of word lines $WL_i$, $WL_j$ and $WL_k$, respectively. The gates of MOS transistors 23 to 25, which are connected in common to one another, are connected to bonding pad 26 which is not used in the normal operation mode. The sources of the MOS transistors, which are connected in common to one another, are connected to bonding pad 27 which is not used in the normal operation mode.

In the semiconductor memory device according to the second embodiment, desired stress voltage $V_{ST}$ is applied to bonding pad 27 in the screening test, and gate voltage $V_G$ which is higher than $V_{ST}+V_{TH1}$ ($V_{TH1}$ is threshold voltage of MOS transistors 23 to 25) is applied to bonding pad 26. MOS transistors 23 to 25 are thus turned on to drive all the word lines including $WL_i$, $WL_j$ and $WL_k$ at once.

In the second embodiment, it is effective to supply a desired voltage to bit line $BL_1$ by applying a desired voltage (e.g., ground voltage Vss) to bonding pad 19.

In the second embodiment, either a direct current (D.C.) voltage or an alternating current (A.C.) voltage can be applied to bonding pad 27. To efficiently accelerate a cell transistor in view of time, it is desirable and simple to apply the direct voltage. IF a voltage applied between the gates and sources of MOS transistors 23 to 25 is controlled so as to be equal to a voltage applied to the gate of a transfer gate of drive circuit 33, no problems occur in reliability of the gates of MOS transistors 23 to 25. Of course, MOS transistors 23 to 25 are turned off in the normal operation. This control can be realized, for example, by connecting the gates and sources of MOS transistors 23 to 25 to a ground level (Vss) through very high resistive elements.

If the gate insulation films of MOS transistors 23 to 25 are likely to be destroyed, the screening test can be carried out at the timing shown in the graph of FIG. 3. More specifically, power supply voltage $V_{CC}$ serving as gate voltage $V_G$ is applied to bonding pad 26 and then voltage $V_{ST}$ is applied to bonding pad 27. After the voltage of word lines $WL_i$, $WL_j$ and $WL_k$ increases up to $V_{CC}-V_{TH1}$, a voltage serving as gate voltage $V_g$, which is higher than $V_{ST}+V_{TH1}$, is applied to bonding pad 26. Thus, a voltage which is higher than $V_{ST}+V_{TH1}$ is not applied between the gates and sources of MOS transistors 23 to 25.

FIG. 4 illustrates a semiconductor memory device according to the third embodiment of the present invention. In FIG. 4, reference numerals 28 to 30 indicate MOS transistors, and numeral 31 denotes a bonding pad.

The third embodiment is a modification of the second embodiment and is very effective in preventing the reliability of the semiconductor memory device from being degraded in its normal operation. More specifically, the drains of MOS transistors (second MOS transistors) 28 to 30 are connected to the sources of MOS transistors (first MOS transistors) 23 to 25, respectively. The gates of MOS transistors 28 to 30 are connected in common to one another and are connected to bonding pad 31 which is not used in the normal operation. The sources of MOS transistors 28 to 30 are connected in common to one another and are connected to bonding pad 27 which is not also used in the normal operation.

In the semiconductor memory device according to the third embodiment, when a stress is applied, gate voltage $V_{G1}$ applied to bonding pad 26 and gate voltage $V_{G2}$ applied to bonding pad 31 are set to be not less than $V_{ST}+V_{TH2}$ ($V_{TH2}$ represents threshold voltages of MOS transistors 23-25 and 28-30). In the normal operation of the semiconductor memory device, for example, power supply voltage $V_{cc}$ is applied to bonding pad 26 as gate voltage $V_{G1}$, and voltage $V_{SS}$ (e.g. ground voltage) is applied to bonding pad 31 as gate voltage $V_{G2}$. This situation is realized, for example, by connecting node $V_{G1}$ to a power supply level (Vcc), node $V_{G2}$ and $V_S$ to a ground level (Vss), respectively, through very high resistive elements. The drains of MOS transistors 28 to 30 are thus charged with $V_{CC}-V_{TH2}$ and, in other words, the potential of $V_{CC}-V_{TH2}$ is applied to the gate oxide films of MOS transistors 28 to 30 when Vss is a ground voltage, in the normal operation. Further, the voltage of $V_{BOOT}$ (potential of a selected word line)$-V_{CC}$ is applied to the gate oxide films of MOS transistors 23 to 25. It is therefore possible to solve the problem wherein the reliability of the device might be degraded in the normal operation. Since a voltage applied to the gate oxide films of MOS transistors 23 to 25 connected to non-selected word lines is $V_{CC}$, there is no problem of the degradation of the reliability.

The semiconductor memory devices according to the second and third embodiments have the same effects as obtained from the semiconductor memory device according to the first embodiment.

It is desirable that the sizes of MOS transistors 23-25 and 28-30 are determined so that, even though a stress may destroy a gate insulator film in a particular word line and a leakage decreases the level of voltage on the word line, a voltage applied to the other word lines cannot be influenced. Even if one portion of a gate insulator film is destroyed, the stress to the other part can be still accelerated.

In the first to third embodiments, a predetermined voltage is applied from a bonding pad which is not used in the normal operation mode. The bonding pad can be replaced with a bonding pad which is used in the normal operation mode by providing a means for switching its function between the normal operation mode and the stress application mode.

In the first to third embodiments, bonding pads used for the screening test can be shared by plural chips or shared by all the chips on a wafer.

In the first to third embodiments, all the word lines may be drive at once in the screening test. Alternatively, a select number of words lines whose number is not less than that of the word lines selected in the normal operation mode can be driven at once.

Though the above embodiments are applied to the DRAM, they can be applied to a SRAM in the same manner. More specifically, as shown in FIG. 5, memory cell 32 of the DRAM can be replaced with a memory cell of the SRAM. Two bit lines BL, $\overline{BL}$ are usually connected to one SRAM cell and they can be connected to signal line $V_{BL}$ through transistor 14 (shown in FIGS. 1, 2 and 4) for precharging the bit line.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory comprising:
   a plurality of memory cells;
   a plurality of bit lines arranged such that each of said memory cells is coupled to at least one bit line;
   a plurality of first word lines;
   a plurality of second word lines arranged such that each of said memory cells is coupled to one of said second word lines and each of said second word lines is coupled to one of said first word lines;
   selecting means responsive to address data for selecting at least one of said first word lines and at least one of said second word lines; and
   driving means for driving selected ones of said first and second word lines, wherein said selecting means comprises first metal oxide semiconductor (MOS) transistors whose gates receive select signals, whose sources are coupled to said driving means and whose drains are respectively coupled to said first word lines; and second metal metal oxide semiconductor transistors whose gates receive select signals, whose sources are coupled to one of said first word lines and whose drains are respectively coupled to said second word lines; and said driving means including a first voltage source sufficient to simultaneously drive up to all of said first and second word lines during a test operation for detecting an erroneous operation of memory cells of said semiconductor memory.

2. A semiconductor memory according to claim 1, wherein said memory is a dynamic random access memory.

3. A semiconductor memory according to claim 1, wherein said memory is a static random access memory.

4. A semiconductor memory according to claim 1, wherein said first voltage source comprises a voltage terminal pad coupled to said first plurality of word lines.

5. A semiconductor memory according to claim 4, wherein a direct current (D.C.) voltage is supplied to said voltage terminal pad.

6. A semiconductor memory according to claim 4, wherein an alternating current (A.C.) voltage is supplied to said voltage terminal pad.

7. A semiconductor memory according to claim 1, wherein said plurality of bit lines is coupled to a second voltage source.

8. A semiconductor memory according to claim 7, wherein said second voltage source comprises a voltage terminal pad.

9. A semiconductor memory comprising:
   a plurality of memory cells;
   a plurality of word lines, each word line coupled to a plurality of memory cells and having a first and a second end;
   a plurality of bit lines, each bit line coupled to a plurality of memory cells;
   driving means coupled to the first end of each of said plurality of word lines for driving at least one of said plurality of word lines;
   a first plurality of metal oxide semiconductor (MOS) transistors having their drains respectively coupled to the second ends of said plurality of word lines and having their respective gates coupled to each other;
   a second plurality of metal oxide semiconductor (MOS) transistors having their drains respectively coupled to the sources of said first plurality of metal oxide semiconductor transistors, having their respective gates coupled to each other, and having their respective sources coupled to a first voltage source.

10. A semiconductor memory according to claim 9, wherein said first voltage source comprises a voltage source sufficient to simultaneously drive up to all of said word lines.

11. A semiconductor memory according to claim 9, wherein said first voltage source is a direct current (D.C.) voltage source.

12. A semiconductor memory according to claim 9, wherein said first voltage source is an alternating current (A.C.) voltage source.

13. A semiconductor memory according to claim 9, wherein said memory is a dynamic random access memory.

14. A semiconductor memory according to claim 9, wherein said memory is a static random access memory.

15. A semiconductor memory according to claim 9, wherein said first voltage source comprises a voltage terminal pad coupled to said plurality of word lines.

16. A semiconductor memory according to claim 9, wherein said plurality of bit lines is coupled to a second voltage source.

17. A semiconductor memory according to claim 16, wherein said second voltage source comprises a voltage terminal pad.

18. A semiconductor memory according to claim 9, wherein said respective gates of said first plurality of metal oxide semiconductor transistors are coupled to a voltage terminal pad.

19. A semiconductor memory according to claim 18, wherein said respective gates of said second plurality of metal oxide semiconductor transistors are coupled to a voltage terminal pad.

* * * * *